United States Patent [19]

Jouanneault

[11] 3,959,876

[45] June 1, 1976

[54] METHOD OF FORMING A PRINTED CIRCUIT WITH MEANS FOR PREVENTING ACCUMULATION OF METAL ALLOY

[75] Inventor: Jean-Pierre Jouanneault, Versailles, France

[73] Assignee: Compagnie Industrielle des Telecommunications Cit-Alcatel, France

[22] Filed: July 14, 1975

[21] Appl. No.: 595,360

Related U.S. Application Data

[63] Continuation of Ser. No. 425,555, Dec. 17, 1973, abandoned.

[30] Foreign Application Priority Data

Dec. 15, 1972 France .............................. 72.44870

[52] U.S. Cl. .................................... 29/628; 29/625; 174/68.5; 317/101 B; 339/17 C; 339/275 B
[51] Int. Cl.² .......................................... H05K 3/32
[58] Field of Search ............... 174/68.5; 317/101 B, 317/101 C; 339/17 C, 275 B; 29/626, 625, 628

[56] References Cited
UNITED STATES PATENTS

| | | |
|---|---|---|
| 2,985,709 | 5/1961 | Mammola .......................... 174/68.5 |
| 3,033,914 | 5/1962 | Acosta-Lleras ..................... 174/68.5 |
| 3,531,579 | 9/1970 | Katz .................................... 174/68.5 |
| 3,833,838 | 9/1974 | Christiansen ................... 174/68.5 X |

Primary Examiner—Darrell L. Clay
Attorney, Agent, or Firm—Craig & Antonelli

[57] ABSTRACT

A method enabling the improving of the connections of printed circuits or the like by preventing the accumulation of droplets of metal alloy at selected connection points of conductive strips disposed on at least one surface of insulating insualting planar support member of the printed circuit. The method includes forming sharp appendages of the strips at selected connection points of the strips which appendages point in substantially the same direction and are located proximate to the selected connection points. Upon applying a film of metal alloy over the conductive strips, the sharp appendages serve for driving the excess metal alloy away from the selected connection points under the action of surface-tension during the formation of the film of metal alloy on the strip.

5 Claims, 4 Drawing Figures

METHOD OF FORMING A PRINTED CIRCUIT WITH MEANS FOR PREVENTING ACCUMULATION OF METAL ALLOY

This is a continuation of application Ser. No. 425,555, filed Dec. 17, 1973 now abandoned.

The invention concerns an arrangement for improving the connections of printed circuits or the like.

The present invention, applicable more particularly to the printed circuit technology, is more particularly suitable for use in a technique for the protection of the said circuits by the laminar application of a film of alloy in the melted state. That technique makes it possible, on the one hand, to protect the conductive tapes of the circuit plates from oxidization and, on the other hand, subsequent welding operations to be made easier.

The said technique consists in making the plates pass between two cylinders rotating in reverse directions and constituting a sort of rolling mill; the lower cylinder is half immersed in a melted alloy bath and draws away, in its rotating movement, a film of alloy which is applied to the surfaces of the printed circuits. The disadvantage of that method is the forming of a deposit of droplets of alloy on the edges of the said metal-coated surfaces opposite to the edges on which the rollers bear. This is due to the breaking of the liquid alloy film when the rollers leave the edge of the end part of a metal-coated surface to pass over an insulating part of the plate.

These droplets forming slight excess thicknesses are detrimental when they are situated on the parts of the metal-coated tapes intended to be connected together. Indeed, they cause defective mechanical and electrical contacts after connection of the plates.

When the connectable ends of the circuits of the plates are situated on only one side, the forming of droplets on the said ends on inserting the plate between the rollers by that same side is avoided. But when the connectable ends are distributed on at least two sides of the plate, the said ends of one of the sides are forcibly marked with droplets of alloy.

The removal of these droplets was obtained, up till now, by means, for example, of a supermelting method by spraying the plates with boiling oil, a method which required several extra treatments for the said plates and consequently gave rise to a high cost price.

The aim of the present invention is to dispense to full advantage with the supermelting operation by effecting a slight modification in the shape of the connectable parts, at the time when the circuits are constituted, the said modification enabling the obtaining of complete planeness of the said connectable parts.

According to the invention, the conductive surfaces of connectable parts of the plate are extended in a determined direction as a function of the angle of attack of the plate by the rollers of the laminating machine, the extensions of the said surfaces being produced on the lateral edges of the said parts opposite to those attacked by the said rollers, the said extensions being pointed in the reverse direction to the passing of the plate between the said rollers.

According to another characteristic of the invention, the conductive surfaces of the connectable parts of the printed circuits are extended by appendages according to diverse shapes determined as a function of the spacing of the available insulating material between the said appendages and the neighboring conductive tape.

According to another characteristic of the invention, only the conductive surfaces of the connectable parts whose tapes which extend them are pointed so that, at the time of the passing of the plate between the rollers, they are metal-coated before the said connectable parts or at the same time as the latter, need to be provided with appendices.

Other characteristics may become apparent from the detailed description of an embodiment of the invention, given by way of an example having no limiting character, with reference to the accompanying figures, among which:

Figure 1:
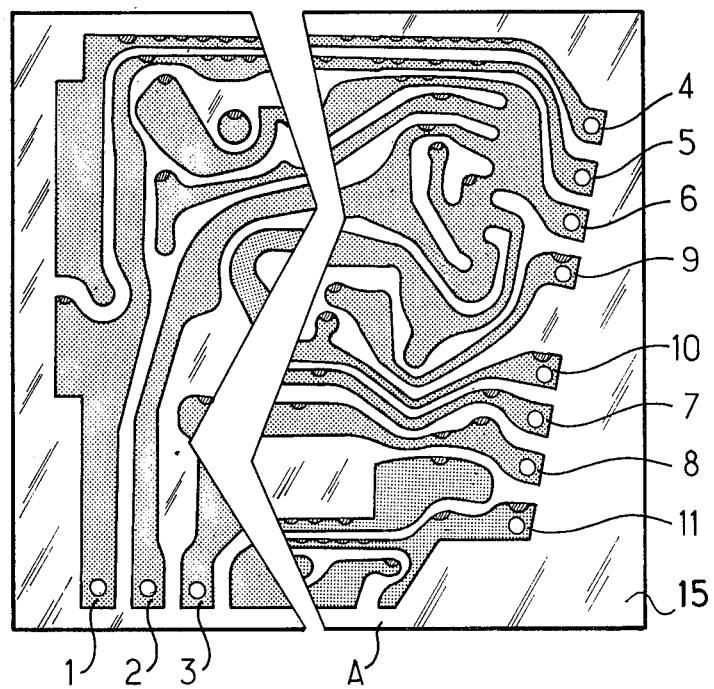
FIG. 1 shows a printed circuit plate whose tin-coating has been effected without making use of the device according to the invention.
Figure 2:
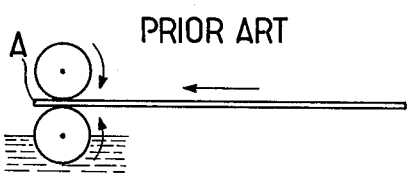
FIG. 2 shows the direction of the passing of the plate between the rollers of the tin-coating machine.
Figure 4:
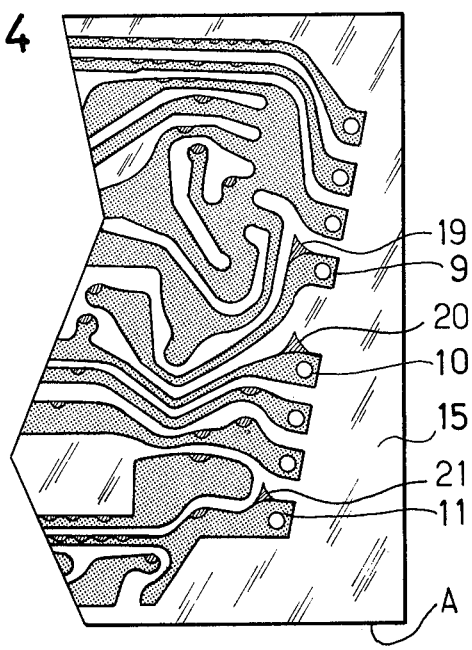
FIG. 4 shows the aspect, after tin-coating of the connectors of a printed circuit plate which has been subjected to the arrangement according to the invention.

The white surfaces of the printed circuit plates shown in FIGS. 1 and 4 constitute the insulating material of the said plate 15 and the shaded surfaces constitute the printed circuits or the like of the said plate. The hatch parts shown on the printed circuits represent the droplets of tin deposited after the tin-coating operation, the plate having been inserted between the rollers of the tin-coating machine from its side A as shown in FIG. 2.

It will be observed that the droplets of tin form on the edges of the tapes of the printed circuits opposite to the direction of the passing of the rollers. The connectable parts such as 1, 2, 3 whose tapes are perpendicular to the rollers and whose ends are tin-coated first do not have droplets, the liquid tin drawn along by the rollers being spread by capillarity on the said tapes. The same case applies to the connectable parts 4, 5, 6, 7, 8 in which the immediate extensions of the tapes are pointed obliquely in relation to the parallel rollers at the side 1 of the plate, for laminated tin spreads freely on the said extensions which are tin-coated after the connectable parts.

Figure 3:
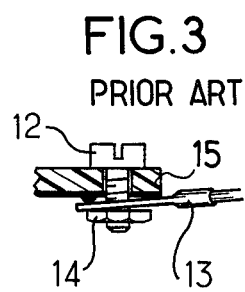
FIG. 3 shows a defective connection due to the depositing of a drop of tin on a printed circuit connector which has not been subjected to the arrangement according to the invention.

On the other hand, the connectable parts 9, 10, 11, whose extensions are tin-plated before the said parts, each have a drop of tin causing a defective connection, such as the screw connection 12, the sleeve connection 13 and nut connection 14 shown in FIG. 3.

In order to overcome that defect, the connectable parts such as 9, 10, 11 are, as soon as the circuits are designated, extended by an appendage 19, 20, 21 (FIG. 4) on the side on which the drop of tin is deposited. The tin-coating operation then enables the directing of the drop of tin to the corresponding appendage 19, 20, 21. The useful surface of the connectable part is thus free from any excess thickness.

It must be understood that the invention is not limited to the embodiment described and shown, which has been given only by way of an example. Without going beyond the scope of the invention, details may be modified, certain arrangements may be changed or certain means may be replaced by equivalent means. More particularly, the appendages provided on the connectors may have any shape produced as a function of that of the insulating zones available provided between the circuits and of those of the connectable surfaces.

What is claimed is:

1. A method of disposing a film of metal alloy over a plurality of conductive strips disposed on at least one surface of an insulating planar support member forming a printed circuit, the method comprising forming means for preventing the accumulation of the metal alloy at selected connection points of the strips under the action of surface tension during the formation of the film, the accumulation preventing means being formed as sharp appendages of the strips, all of the appendages pointing in substantially the same direction and located proximate to the selected connection points, and applying a film of metal alloy over the conductive strips with the accumulation preventing means driving the excess metal alloy away from the selected connection points under the action of surface-tension during the formation of the film of metal alloy on the strips.

2. A method according to claim 1, wherein the step of applying the film of metal alloy includes rolling the liquid metal alloy across the one surface of the planar support member in the direction in which the appendages point.

3. A method according to claim 1, wherein the step of applying the film of metal alloy includes rolling the liquid metal alloy containing tin as a component across the one surface of the planar support member in the direction in which the appendages point.

4. A method according to claim 1, wherein the step of forming means for preventing the accumulation of the metal alloy includes selecting selected connection points of the strips as the points arranged for receiving external leads to be fixed on the strips with the aid of mechanical means, the appendages preventing an accumulation of excess metal alloy at the selected connection points, and connecting said external leads to said selected connection points by said mechanical means.

5. A method according to claim 1, wherein the setp of forming means for preventing the accumulation of metal alloy includes disposing the sharp appendages on the planar support member with the appendages lying in the plane of the conductive strips, and locating the selected connection points at a predetermined end of the conductive strips at a position arranged for receiving external leads to be connected to the strips by mechanical means, the appendages preventing an accumulation of excess metal alloy proximate to the selected points thereby enabling good electrical and mechanical contact of the external leads with the strips.

* * * * *